(12) United States Patent
Zhang

(10) Patent No.: US 7,104,672 B2
(45) Date of Patent: Sep. 12, 2006

(54) PROJECTION LENS FOR LIGHT SOURCE ARRANGEMENT

(75) Inventor: Long Bao Zhang, Anaheim, CA (US)

(73) Assignee: A.L. Lightech, Inc., Anaheim, CA (US)

( * ) Notice: Subject to any disclaimer, the term of this patent is extended or adjusted under 35 U.S.C. 154(b) by 156 days.

(21) Appl. No.: 10/958,311

(22) Filed: Oct. 4, 2004

(65) Prior Publication Data

US 2006/0071245 A1 Apr. 6, 2006

(51) Int. Cl.
*F21V 7/00* (2006.01)
*F21Y 11/02* (2006.01)

(52) U.S. Cl. ...................... 362/308; 362/326
(58) Field of Classification Search ............... 362/244, 362/308, 326; 257/98, 99; 359/554, 742, 359/743

See application file for complete search history.

(56) References Cited

U.S. PATENT DOCUMENTS 5,323,302 A * 6/1994 Bertling et al. ............. 362/308
6,604,839 B1 * 8/2003 Coleman et al. ............ 362/231
2006/0018122 A1 * 1/2006 Negley ....................... 362/326

* cited by examiner

*Primary Examiner*—Sandra O'Shea
*Assistant Examiner*—James W Cranson, Jr.
(74) *Attorney, Agent, or Firm*—Raymond Y. Chan; David & Raymond Patent Group

(57) ABSTRACT

A light source arrangement for substantially enhaning the lighting intensity of the light beams emitted from the light source therefore includes a lens body and an illumination unit. The lens body has an illumination portion defining a light projecting surface and at least a diffraction portion defining a light diffraction surface inclinedly extended at a diffraction angle, wherein a diffraction density of the illumination portion is different from that of the diffraction portion. The illumination unit is covered by the lens body for radially generating light towards the illumination portion. When the light reaches the light diffraction surface of a diffraction portion at an angle larger than the diffraction angle, the light is substantially reflected at the light diffraction surface back towards the light projecting surface, such that the light from the illumination unit is converged to project at the light projecting surface of the lens body.

19 Claims, 4 Drawing Sheets

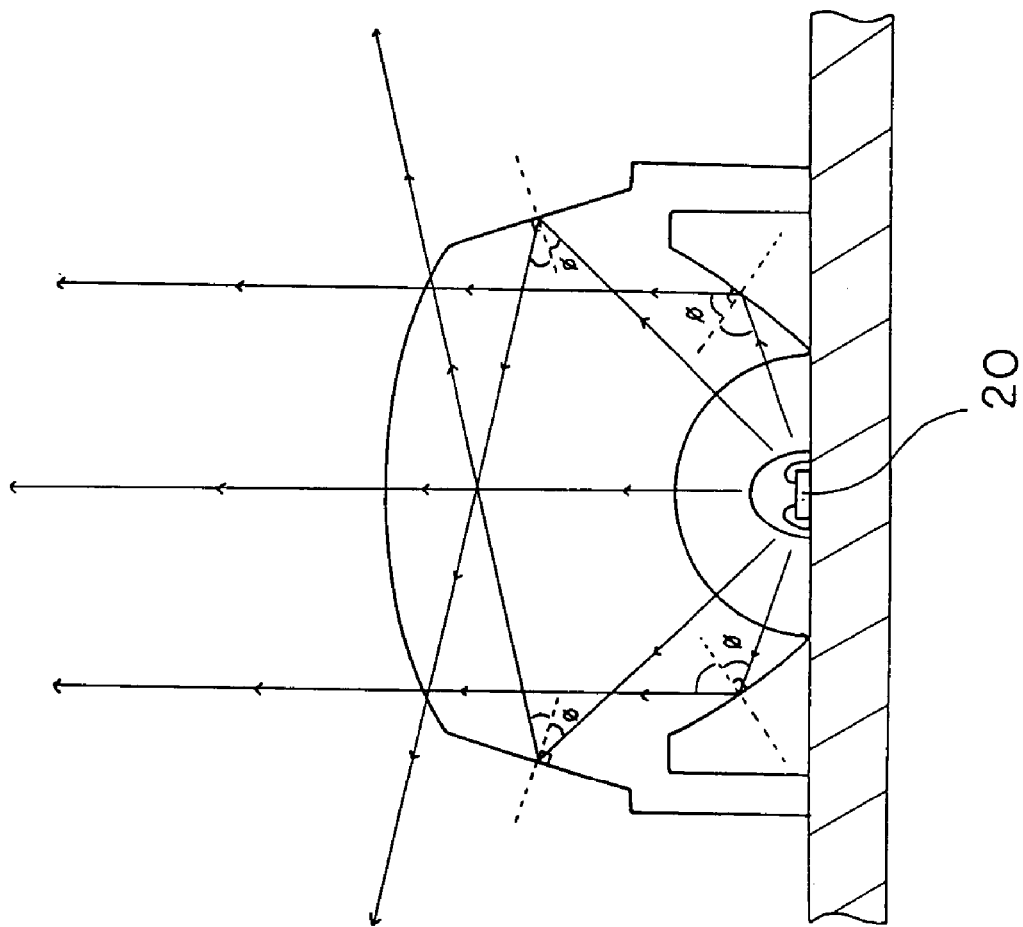

US 7,104,672 B2

PROJECTION LENS FOR LIGHT SOURCE ARRANGEMENT

BACKGROUND OF THE PRESENT INVENTION

1. Field of Invention

The present invention relates to a lens, and more particularly to a projection lens which is capable of effectively converging, by virtue of a predetermined pattern of diffraction, diverging light beams emitted from a single light source, such as a LED, to form a high intensity, coherent and high quality light effect having an accurate projection angle.

2. Description of Related Arts

LED (Light Emitting Diode) has been widely utilized as an efficient and comparatively economical light source for providing illumination in different surrounding circumstances. For example, a plurality of LEDs may be electrically connected to form rope light, indication light source, Christmas light string, advertisement sign board, and etc. Different combinations of LEDs of differing colors may be arranged in a particular manner such that numerous light effects can be generated for differing applications.

Over the years, engineers have been actively resolving about the limitations of conventional LEDs in an attempt to maximize the applications thereof. For example, they have developed some kinds of light holders which can convert the point of light sources into a single line source. As a result, various practical applications which are traditionally performed by expensive and non-reliable light sources, such as advertisement signs and interior/exterior decoration lighting, have been gradually replaced by LEDs applications.

In some other cases, a reflective layer is coated on the light holder so that the illumination provided by the LEDs in that particular light holder would be of improved quality and intensity. It is expected that, given the fierce competition in commercial world, the chasing for more economical yet better quality illumination devices would not stop. However, such reflection coating surface merely can provide limited effect and generally has to position behind the LED. In fact, for lighting intensity enhancement, a projection lens in front of the light source is more preferable than a reflection surface behind the light source. Moreover, during the electrolytic coating process of the reflective surface, environmental pollutants, waste water and other poisonous materials are produced too.

SUMMARY OF THE PRESENT INVENTION

A main object of the present invention is to provide a projection lens for light source arrangement which can substantially enhance the lighting intensity of the light beams emitted from the light source therefore.

Another object of the present invention is to provide a projection lens for light source arrangement, which is capable of effectively converging, by virtue of a predetermined pattern of diffraction, diverging light beams emitted from one or more single light sources, such as LED, to form a high intensity, coherent and high quality light effect having an accurate projection angle.

Another object of the present invention is to provide a light source arrangement having a projection lens that converges diverging light beams emitted from a single light source by total internal reflections such that no reflective coating is required.

Another object of the present invention is to provide a projection lens for light source arrangement, which employs simple diffraction theory to a lens body to effectively reflect otherwise diverging light beams emitted from a single point of light source or gathering points of light sources into a coherent, high quality and converging light source arrangement. In other words, no coating is required.

Another object of the present invention is to provide a projection lens for light source arrangement to substitute the reflection surface to avoid generating any environmental pollutants, waster water or other poison chemicals.

Another object of the present invention is to provide a projection lens for light source arrangement, which is capable of providing a 100% of reflective efficiency while the aluminum coated reflective surface can generally provide a 70% reflective efficiency. Generally speaking, the projection lens of the present invention enhances the reflective efficiency for about 30% in comparison with the conventional metallic coated reflective surface.

Another object of the present invention is to provide a light source arrangement, which is simple in structure, easy to manufacture, convenient to use and does not involve complicated electronics, so as to minimize manufacturing and the ultimate selling price of the present invention.

Accordingly, in order to accomplish the above objects, the present invention provides a light source arrangement, comprising:

a lens body having an illumination portion defining a light projecting surface and a light receiving surface, and at least a diffraction portion defining a light diffraction surface inclinedly extended at a diffraction angle from the light receiving surface of the illumination portion, wherein a diffraction density of the illumination portion is lower than that of the diffraction portion; and an illumination unit disposed at the lens body for radially generating light towards the light receiving surface to partially penetrate through the illumination portion to the light projecting surface thereof and to partially penetrate through the illumination portion to the diffraction portion, wherein when the light reaches the light diffraction surface of the diffraction portion at an angle larger than the diffraction angle, the light is reflected at the light diffraction surface of the diffraction portion towards the light projecting surface, such that the light from the illumination unit is converged to project at the light projecting surface of the lens body.

These and other objectives, features, and advantages of the present invention will become apparent from the following detailed description, the accompanying drawings, and the appended claims.

BRIEF DESCRIPTION OF THE DRAWINGS

FIG. 1B is a schematic view of the light source arrangement according to the above preferred embodiment of the present invention, illustrating the light being reflected at the diffraction portion.

DETAILED DESCRIPTION OF THE PREFERRED EMBODIMENT

Figure 1A:
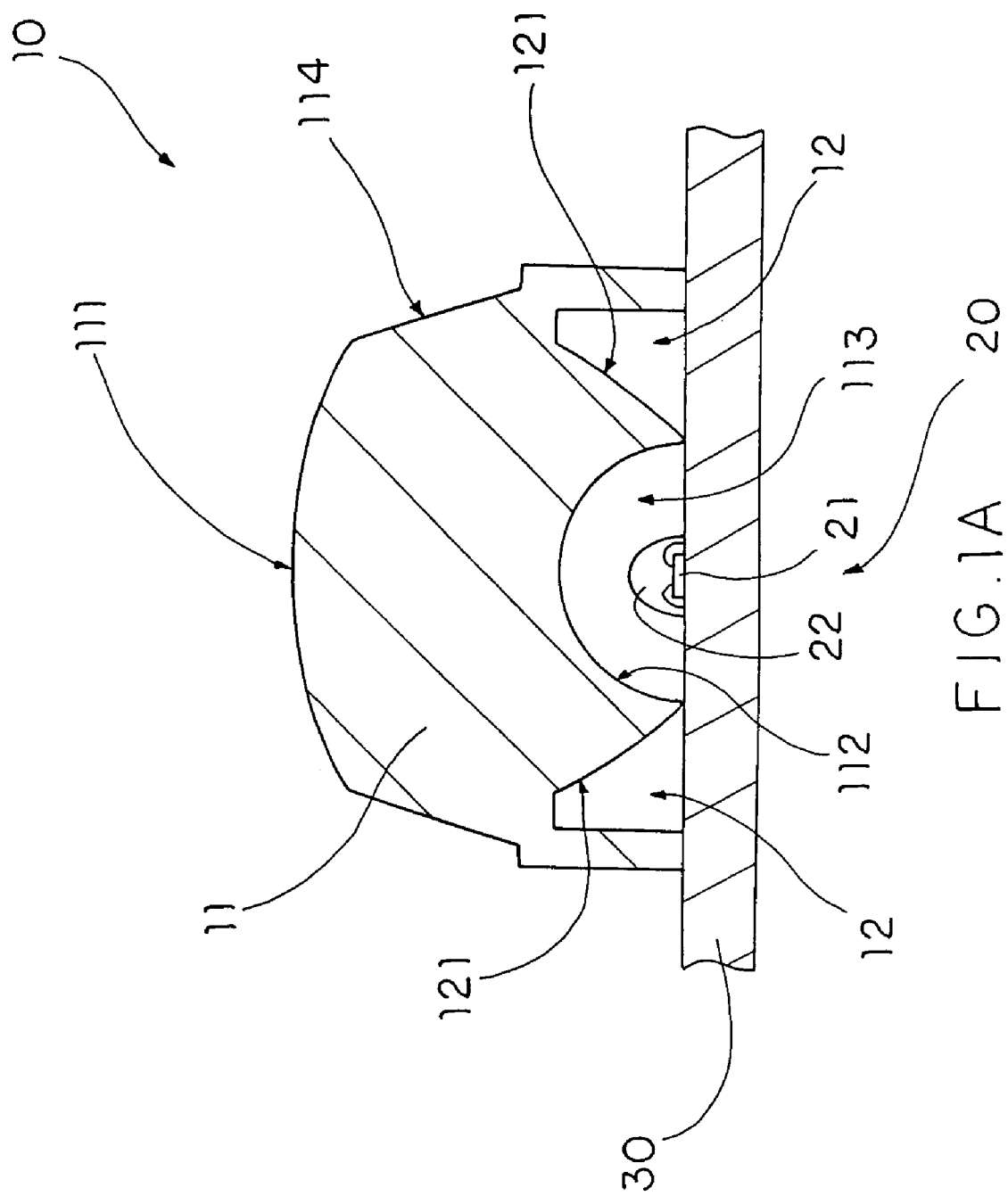
FIG. 1A is a sectional side view of the light source arrangement according to a preferred embodiment of the present invention.

Referring to FIGS. 1A and 1B of the drawings, a light source arrangement according to a preferred embodiment of the present invention is illustrated, in which the light source arrangement comprises at least a lens body 10 and an illumination unit 20.

The lens body 10 has an illumination portion 11 defining a light projecting surface 111 and a light receiving surface 112, and at least a diffraction portion 12 defining a light diffraction surface 121 inclinedly extended at a diffraction angle φ from the light receiving surface 112 of the illumination portion 11, wherein a diffraction density of the illumination portion 11 is different from that of the diffraction portion 12.

The lens body 10 covers the illumination unit 20 that radially generates light towards the light receiving surface 112. A first portion of the light emitted from the illumination unit 20 penetrates through the illumination portion 11 to the light projecting surface 111 thereof while a second portion of the light penetrates through the illumination portion 11 to the diffraction portion 12, wherein when the light reaches the light diffraction surface 121 of the diffraction portion 12 at an angle larger than that diffraction angle φ, the light would be substantially reflected at the light diffraction surface 121 back towards the light projecting surface 111, such that the light from the illumination unit 20 is converged to project at the light projecting surface 111 of the lens body 10.

Accordingly, the diffraction density of the illumination portion 11 is larger than that of the diffraction portion 12 such that when an illumination angle of the light projects towards the light diffraction surface 121 is larger than the diffraction angle φ of the diffraction portion 12, the light is reflected at the light diffraction surface 121 towards the light projecting surface 111.

According to the preferred embodiment of the present invention, the lens body 10 further has a receiving cavity 113 indently formed at the illumination portion 11 to define the light receiving surface 112 as a surrounding wall of the receiving cavity 113, wherein the illumination unit 20 is disposed in the receiving cavity 113 for generating radially propagating light towards the lens body 10 through the light receiving surface 112.

The illumination unit 20 is preferably embodied as diodes of a conventional LED. In other words, the illumination unit 20 comprises a diode 21 and a LED casing 22 receiving the diode 21 therein to radiate light at around 180° radially extended from the LED casing. Accordingly, the receiving cavity 113 preferably has a semi-spherical shape wherein the illumination unit 20 is disposed at the focus point of the receiving cavity 113. In addition, the light diffraction surface 121 is extended from the surrounding wall of the receiving cavity 113 in an edge to edge manner such that the light generated from the illumination unit 20 is adapted to penetrate through the surrounding wall (i.e. the light receiving surface 112) of the receiving cavity 113 towards the light diffraction surface 121. It is worth to mention that only the diode 21 can be disposed in the receiving cavity 113 for radially generating light towards the lens body 10 such that the lens body 10 functions as the LED housing 22. In addition, more than two diodes 21 can be disposed in the receiving cavity 113 to generate different colors of light so as to create a coloring effect of the light source arrangement.

Referring to FIG. 1B of the drawings, the diffraction portion 12 is peripherally and formed at a side portion of the lens body 10 to encirclingly surround the illumination unit 20. In other words, the diffraction portion 12 of the lens body 10 is peripherally formed at a position adjacent to the illumination portion 11 to surround the illumination unit 20 so as to communicate the light receiving surface 111 with the light diffraction surface 121, such that when the illumination unit 20 radially generates the light towards the light receiving surface 111, the light partially projects towards the light diffraction surface 121. Thus, the illumination unit 20 is adapted to illuminate light radially to partially project to the light diffraction surface 121. In other words, the diffraction portion 12 is formed adjacent to the receiving cavity 113 to optically communicate the receiving cavity 113 with the diffraction portion 12.

The light projecting surface 111 is formed as a top curved surface of the lens body 10 having a predetermined radius curvature which defines a predetermined angle of illumination by which the light penetrating through the illumination portion 11 is substantially limited for emitting out of the lens body 10. For example, the radius of curvature may be embodied as defining an illumination angle of around 70° with respect to the illumination unit 20.

The illumination portion 11 and the diffraction portion 12 have different diffraction densities respectively in such a manner that the light passing from the illumination portion 11 is arranged to be diffracted by the light diffraction surface 121 in accordance with the well-established Snell's Law of diffraction. In particular, the incidence angle of the light beams impinging on the light diffraction surface 121 is greater than a threshold angle of total internal reflection in accordance with a ratio of diffraction density of the illumination portion 11 and the diffraction portion 12, such that light impinging on the light diffraction surface 121 will be reflected back to the illumination portion 11 by total internal reflection. As a result, the reflected light beams are capable of emitting out of the illumination portion 11 through the light projecting surface 111, as shown in FIG. 1B.

It is worth mentioning that the different diffraction densities of the illumination portion 11 and the diffraction portion 12 can be achieved by manufacturing the respective portions with different materials. According to the preferred embodiment of the present invention, the lens body 10 has a diffraction cavity filled with air formed at the illumination portion 11 of the lens body 10 so as to form the light diffraction surface on an inner sidewall of the diffraction cavity, whereas the diffraction portion 12 is made of material having a diffraction density higher diffraction density than that of air.

It is also noteworthy that the illumination unit 20 is not limited to LED, since the theory of total internal reflection applies to virtually any source of visible light, a wide variety forms of light source may be utilized as the illumination unit 20. For instances, it may be embodied as a conventional mini-light bulb.

Figure 2:
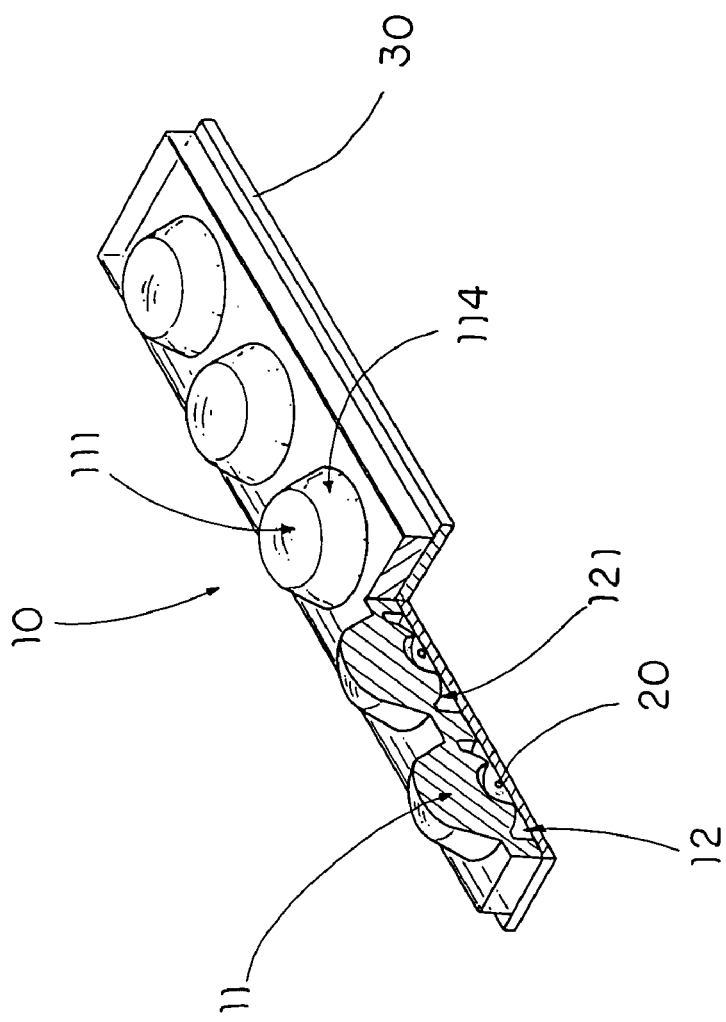
FIG. 2 is a perspective view of a light source arrangement according to the above preferred embodiment of the present invention.

Referring to FIG. 2 of the drawings, a plurality of illumination units 20 are alignedly supported on an elongated supporting base 30, wherein the lens bodies 10 are spacedly and integrally mounted on the supporting base 30 to align with the illumination units 20 to form an elongated light illumination device. In other words, the diffraction portion 12 of the lens body 10 is formed to have a ring shape to surround the illumination unit 20. Such light illumination device is adapted to perform a wide range of functions. For example, it may act as a rigid rope light to replace conventional fluorescent lamp. Accordingly, the supporting base 30 is preferably embodied as a heat sink which is capable of extracting heat generated in the course of illumination by the illumination unit 20. Alternatively, the supporting base 30 can be embodied as a circuit board to electrically connect the illumination unit 20 with a power source.

From the forgoing descriptions, it can be observed that light emitted from the illumination unit 20 would be converged and reflected to go out of the lens body 10 through the light projecting surface 111 so as to generate a coherent, high intensity, and high quality illumination. There is no need to have any coating, such as a light reflective layer, formed inside the lens body 10 in order to achieve the necessary reflection.

It is also worth mentioning that since the light projecting surface 111 has a predetermined radius of curvature, it may be utilized as a convex lens for converging high intensity light beams to be impugned onto a specific focus point. As a result, the present invention definitely has a wide range of applications.

As an obvious alternative, the illumination unit 20 may be directly embedded on the lens body 10. In other words, the illumination unit 20 is fittedly received in the lens body 10 wherein the receiving cavity 13 is shaped and sized to fittedly receive the illumination unit 20 within the lens body 10 such that the lens body 10 forms as a LED casing to protect the LED therein. In other words, the diodes of the illumination unit 20 are disposed in the lens body 10 to form a LED.

It is worth to mention that the illumination unit 20 can be a conventional LED disposed in the lens body 10 such that the light generated from the LED can be converged to project at the light projecting surface 111 of the lens body 10.

Moreover, in order to enhance a converging performance and light intensity of the present invention, the illumination portion 11 of the lens body 10 further has a reflection surface 114 integrally extended from the light projecting surface 111 wherein when the light projects towards the reflection surface 114 either directed from the light receiving surface 112 or reflected by the light diffraction surface 121, the light will be reflected at the reflection surface 114 towards the light projecting surface 111 so as to further converge the light from the illumination unit 20 towards the light projecting surface 111 of the lens body 10.

Accordingly, where the light reflected by the light diffraction surface impinges on the reflecting surface 114 at an angle greater than a diffraction angle φ, due to diffraction density difference between and the illumination portion 11 and the exterior of the lens body 10, the light would then reflected back towards the light projecting surface 111 which then goes out to the exterior of the lens body 10. Thus, the reflecting surface 114 helps to converge and enhance a light intensity of the illumination emitted from the lens body 10.

Figure 3:
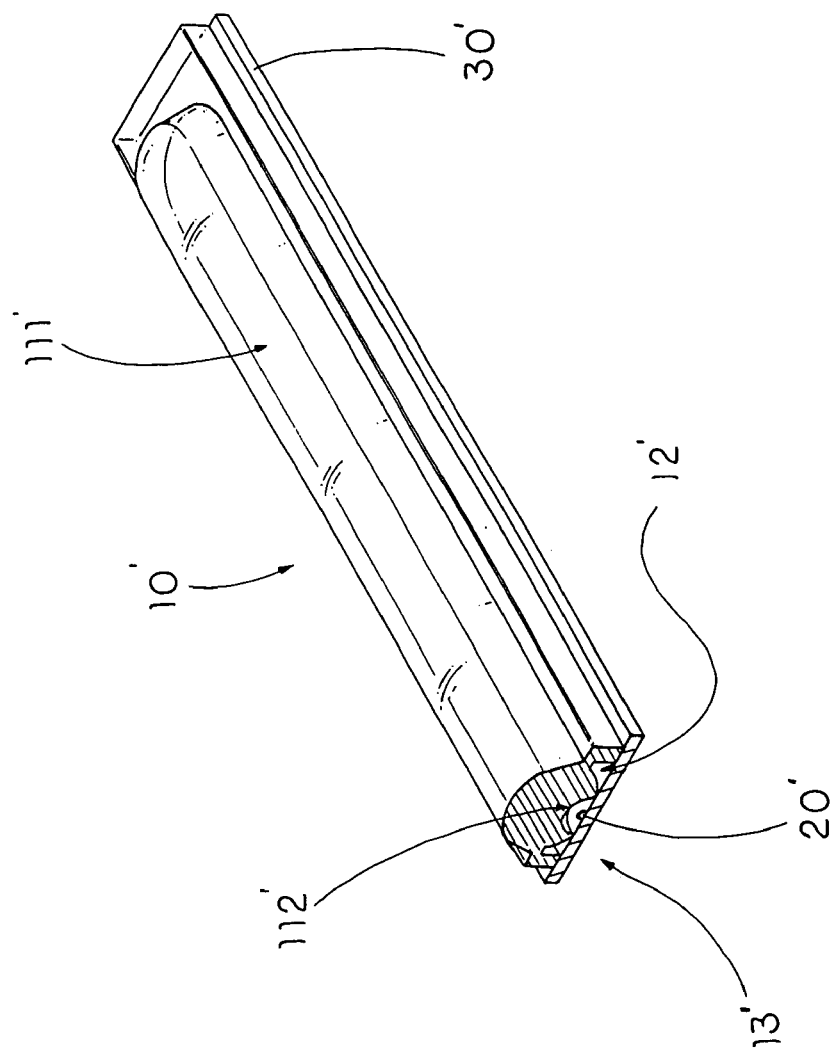
FIG. 3 illustrates an alternative mode of the light source arrangement according to the above preferred embodiment of the present invention.

Referring to FIG. 3 of the drawings, an alternative mode of the light source arrangement according to the above preferred embodiment of the present invention is illustrated. According to the first alternative mode, the light source arrangement comprises a supporting base 30', a plurality of the illumination units 20' spacedly disposed on the supporting base 30', and a plurality of lens bodies 10' mounted on the supporting base 30' to align with the illumination units 20' respectively.

Accordingly, the lens bodies 10' are integrally extended to form an elongated body wherein the receiving cavities 13' are communicating with each other to form an elongated channel along the supporting base 30' such that the illumination units 20' are spacedly disposed within the elongated channel. In other words, the light projecting surfaces 111' of the lens bodies 10' are integrally extended to form an outer side of the elongated body and the light receiving surfaces 112' of the lens bodies 10' are integrally extended to form a surrounding wall of the elongated channel. It is worth to mention that two diffraction portions 12' are formed along two sides of the elongated body.

Therefore, the lights from the illumination units 20' are converged to project at the light projecting surfaces 111' of the lens bodies 10' to form a line-source light arrangement along the supporting base 30'.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A light source arrangement, comprising:
   a lens body having an illumination portion defining a light projecting surface, and at least a diffraction portion defining a light diffraction surface inclinedly extended at a diffraction angle, wherein a diffraction density of said illumination portion is different from that of said diffraction portion; and
   an illumination unit being covered by said lens body for radially generating light towards said illumination portion, wherein a first portion of said light emitted from said illumination unit penetrates through said illumination portion to said light projecting surface thereof while a second portion of said light penetrates through said illumination portion to said diffraction portion, wherein when said light reaches said light diffraction surface of said diffraction portion at an angle larger than said diffraction angle, said light is substantially reflected at said light diffraction surface back towards said light projecting surface, such that said light from said illumination unit is converged to project at said light projecting surface of said lens body.

2. The light source arrangement, as recited in claim 1, wherein said diffraction density of said illumination portion is larger than that of said diffraction portion such that when said illumination angle of said light projects towards said light diffraction surface is larger than said diffraction angle of said diffraction portion, said light is reflected at said light diffraction surface towards said light projecting surface.

3. The light source arrangement, as recited in claim 1, wherein said diffraction portion of said lens body is peripherally formed at a position adjacent to said illumination portion to surround said illumination unit, such that when said illumination unit radially generates said light projecting towards said light diffraction surface, said light is reflected to project towards said light projecting surface of said lens body.

4. The light source arrangement, as recited in claim 2, wherein said diffraction portion of said lens body is peripherally formed at a position adjacent to said illumination portion to surround said illumination unit, such that when said illumination unit radially generates said light projecting towards said light diffraction surface, said light is reflected to project towards said light projecting surface of said lens body.

5. The light source arrangement, as recited in claim 1, wherein said lens body further has a diffraction cavity formed at said diffraction portion to form said light diffraction surface on an inner sidewall of said diffraction cavity, wherein said diffraction cavity is filled with air having a diffraction density lower than a diffraction density of said illumination portion of said lens body, such that when said light penetrates through said illumination portion towards said diffraction cavity, said light is reflected at said light diffraction surface.

6. The light source arrangement, as recited in claim 2, wherein said lens body further has a diffraction cavity formed at said diffraction portion to form said light diffraction surface on an inner sidewall of said diffraction cavity, wherein said diffraction cavity is filled with air having a diffraction density lower than a diffraction density of said illumination portion of said lens body, such that when said light penetrates through said illumination portion towards said diffraction cavity, said light is reflected at said light diffraction surface.

7. The light source arrangement, as recited in claim 4, wherein said lens body further has a diffraction cavity formed at said diffraction portion to form said light diffraction surface on an inner sidewall of said diffraction cavity, wherein said diffraction cavity is filled with air having a diffraction density lower than a diffraction density of said illumination portion of said lens body, such that when said light penetrates through said illumination portion towards said diffraction cavity, said light is reflected at said light diffraction surface.

8. The light source arrangement, as recited in claim 1, wherein said lens body further has a receiving cavity formed at said illumination portion to receive said illumination unit in said receiving cavity at a position that said receiving cavity is coaxially surrounded within said diffraction portion.

9. The light source arrangement, as recited in claim 2, wherein said lens body further has a receiving cavity formed at said illumination portion to receive said illumination unit in said receiving cavity at a position that said receiving cavity is coaxially surrounded within said diffraction portion.

10. The light source arrangement, as recited in claim 4, wherein said lens body further has a receiving cavity formed at said illumination portion to receive said illumination unit in said receiving cavity at a position that said receiving cavity is coaxially surrounded within said diffraction portion.

11. The light source arrangement, as recited in claim 7, wherein said lens body further has a receiving cavity formed at said illumination portion to receive said illumination unit in said receiving cavity at a position that said receiving cavity is coaxially surrounded within said diffraction portion.

12. The light source arrangement, as recited in claim 1, wherein said illumination unit comprises at least a LED disposed at said lens body for radially generating light to partially project towards said diffraction portion.

13. The light source arrangement, as recited in claim 4, wherein said illumination unit comprises at least a LED disposed at said lens body for radially generating light to partially project towards said diffraction portion.

14. The light source arrangement, as recited in claim 7, wherein said illumination unit comprises at least a LED disposed at said lens body for radially generating light to partially project towards said diffraction portion.

15. The light source arrangement, as recited in claim 11, wherein said illumination unit comprises at least a LED disposed at said lens body for radially generating light to partially project towards said diffraction portion.

16. The light source arrangement, as recited in claim 1, wherein said illumination unit comprises at least a diode disposed at said lens body for radially generating light to partially project towards said diffraction portion.

17. The light source arrangement, as recited in claim 4, wherein said illumination unit comprises at least a diode disposed at said lens body for radially generating light to partially project towards said diffraction portion.

18. The light source arrangement, as recited in claim 7, wherein said illumination unit comprises at least a diode disposed at said lens body for radially generating light to partially project towards said diffraction portion.

19. The light source arrangement, as recited in claim 11, wherein said illumination unit comprises at least a diode disposed at said lens body for radially generating light to partially project towards said diffraction portion.

* * * * *